United States Patent
Thomas et al.

(10) Patent No.: US 9,780,774 B2
(45) Date of Patent: Oct. 3, 2017

(54) SYSTEM AND METHOD FOR A SWITCHABLE CAPACITANCE

(71) Applicant: Infineon Technologies AG, Neubiberg (DE)

(72) Inventors: Anthony Thomas, Munich (DE); Winfried Bakalski, Munich (DE); Valentyn Solomko, Munich (DE); Ruediger Bauder, Feldkirchen-Westerham (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/983,228

(22) Filed: Dec. 29, 2015

(65) Prior Publication Data

US 2017/0187368 A1    Jun. 29, 2017

(51) Int. Cl.
  *H03J 5/24*  (2006.01)
  *H03K 17/16* (2006.01)
  *H03K 5/01*  (2006.01)

(52) U.S. Cl.
  CPC .............. *H03K 17/16* (2013.01); *H03J 5/244* (2013.01); *H03K 5/01* (2013.01)

(58) Field of Classification Search
  CPC .............. H03H 11/0422; H03H 11/04; H03H 11/1291; H03H 11/1213; H03K 5/1252
  USPC .............. 327/551–559, 401, 308; 333/81 R; 455/78–80
  See application file for complete search history.

(56) References Cited

U.S. PATENT DOCUMENTS

| | | | | |
|---|---|---|---|---|
| 7,863,941 B1 * | 1/2011 | Nguyen | ................. | G11C 7/065 327/55 |
| 9,209,784 B2 * | 12/2015 | Iversen | ............. | H03H 21/0007 |
| 2014/0011461 A1 | 1/2014 | Bakalski et al. | | |
| 2014/0104132 A1 | 4/2014 | Bakalski et al. | | |
| 2014/0340181 A1 * | 11/2014 | Bakalski | ................. | H03J 5/244 334/55 |
| 2015/0109072 A1 | 4/2015 | Bakalski | | |
| 2015/0288359 A1 | 10/2015 | Bakalski et al. | | |
| 2015/0311883 A1 | 10/2015 | Bakalski | | |
| 2015/0311922 A1 | 10/2015 | Bakalski et al. | | |
| 2015/0349770 A1 | 12/2015 | Bakalski et al. | | |

OTHER PUBLICATIONS

Thomas, A., et al., "A MIM-cap free digitally tunable NMOS capacitor," 2013 European in Microwave Integrated Circuits Conference (EuMIC), Oct. 6-8, 2013, pp. 21-24.

* cited by examiner

*Primary Examiner* — Dinh T Le
(74) *Attorney, Agent, or Firm* — Slater Matsil, LLP

(57) ABSTRACT

In accordance with an embodiment, an adjustable capacitance circuit comprising a first branch comprising plurality of transistors having load paths coupled in series with a first capacitor. A method of operating the adjustable capacitance circuit includes programming a capacitance by selectively turning-on and turning-off ones of the plurality of transistors, wherein the load path of each transistor of the plurality of transistors is resistive when the transistor is on and is capacitive when the transistor is off.

26 Claims, 11 Drawing Sheets

SYSTEM AND METHOD FOR A SWITCHABLE CAPACITANCE

TECHNICAL FIELD

The present disclosure relates generally to an electronic device, and more particularly to a system and method for switchable capacitance.

BACKGROUND

Tunable passive elements, such as capacitors and inductors, are used in a variety of radio frequency (RF) circuits to implement adjustable matching networks for antennas and power amplifiers, and to provide adjusting tuning for high frequency filters. Due to the high demand and production of portable devices, such tunable passive elements may be found in products such as cellular telephones, smart phones and portable computers. Providing tuning to RF circuits in such products allows these products to provide high performance RF transmission and reception in a variety of RF conditions. Programmable tuning is also helpful in RF devices that are configured to operate over different RF bands and/or configured to operate using different standards.

Tunable capacitors may be implemented in a number of ways. For example, a voltage-controlled capacitor may be used to provide a variable capacitance. Such a variable capacitance may be implemented using a reverse-biased diode junction having a capacitance that is inversely proportional to the applied reverse bias voltage. Another way in which a tunable capacitance may be implemented is by using an array of switchable capacitors whose various elements are either connected or disconnected via controllable switches. One challenge in the design of a switchable capacitor is dealing the effects of parasitic capacitance of transistors used to implement the switches. Such parasitic capacitances associated with the switching transistors may add additional capacitance to the switchable capacitance that may decrease the accuracy and the tuning range of the circuit and/or increase parasitic loading.

SUMMARY OF THE INVENTION

In accordance with an embodiment, an adjustable capacitance circuit comprising a first branch comprising plurality of transistors having load paths coupled in series with a first capacitor. A method of operating the adjustable capacitance circuit includes programming a capacitance by selectively turning-on and turning-off ones of the plurality of transistors, wherein the load path of each transistor of the plurality of transistors is resistive when the transistor is on and is capacitive when the transistor is off.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2a-2e illustrate various illustrative switching networks;

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a switchable capacitance that may be used in RF circuits to provide tuning for antennas, matching networks and filters. The invention may also be applied to other systems and applications including other circuits that utilize a programmable capacitance such as digitally tunable oscillators to enable a wide output frequency range.

In embodiments of the present invention, a switchable capacitance circuit includes a plurality of switchable capacitance branches, such that a programmable capacitance may be selected according to the sum of the capacitances of the various branches. At least one of the branches includes a plurality of series connected RF switching transistors coupled in series with a fixed capacitance. A controller is configured to selectively turn on and turn off ones of the series connected switching transistors such that the series combination of the parasitic capacitance of the off-transistors and the fixed capacitance forms a small programmable capacitance that may be used to fine tune the capacitance of the switchable capacitance circuit. In some embodiments, a first branch having the series connected RF switching transistors may be coupled in parallel with a plurality of switchable capacitance branches having binary weighted capacitors. In such embodiments, the controller may select the binary weighted branches according to a binary code and select the series connected switching transistors of the first branch according to a thermometer code. Advantages of some embodiments include the ability to program fine incremental changes in capacitance values with respect to a larger total capacitance for an increased precision tuning ratio.

Figure 1:
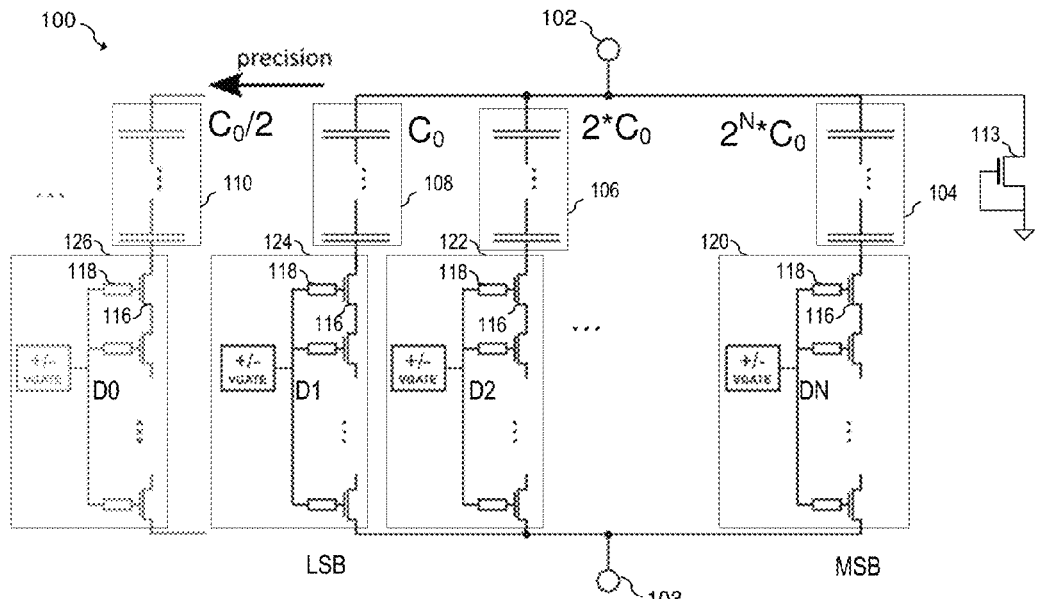
FIG. 1 illustrates a conventional programmable capacitance circuit.

FIG. 1a illustrates a conventional digitally tunable capacitor circuit 100 that includes binary weighted capacitors 104, 106, 108 and 110, each of which is coupled to series switches 120, 122, 124 and 126 respectively. The values of capacitors 104, 106, 108 and 110 are $2^N*C_0$, $2*C_0$, $C_0$ and $C_0/2$, respectively. Each of capacitors 104, 106, 108 and 110 are coupled to output pad 102, as well as to electrostatic discharge (ESD) protection transistor 113. These capacitors may be implemented, for example using metal-insulator-metal (MIM) capacitors, or plurality of such capacitors coupled in series. Each of switches 120, 122, 124 and 126 are connected to output pad 103, such that the amount of capacitance between output pads 102 and 103 is controllable using digital signals DN, D2, D1 and D0. For example, if signal D2 is at a logic high, thereby turning on series switch 122, and signals DN, D2, D1, and D0 or low, thereby turning off series switches 120, 124 and 126, then the capacitive load seen at output pad 102 is about $2*C_0$. Switches 120, 122, 124 and 126 are implemented using series transistors 118 that are each connected to their respective control voltage via resistors 118. As shown, the number of digitally programmable capacitance steps dependent on the number of branches. Thus, in order to add smaller steps for a more precise capacitor setting, more branches can be added and coupled to the least significant bits (LSBs) of the binary input word.

One issue with adding more branches to the digitally tunable capacitor circuit is that the minimum programmable capacitance is limited by the parasitic capacitance of the respective branches. Such parasitic capacitance may be due, for example, to parasitic plate to substrate capacitance of fixed capacitors 104, 106, 108 and 110 or to the parasitic capacitance of switches 120, 122 and 124 when they are turned off. Generally, the capacitance of a multi-branch tunable capacitor circuit may be expressed as:

$$C = \sum_{i=1}^{N} Ci_{on}|_{sw=on} + Ci_{off}|_{sw=off}, \quad (1)$$

where C is the total capacitance of the multi-branch tunable capacitor circuit, N is the number of branches, $Ci_{on}$ is the capacitance of the $i^{th}$ branch when the $i^{th}$ branch is turned on and $Ci_{off}$ is the capacitance of the $i^{th}$ branch when the $i^{th}$ branch is turned off and is dominated by the parasitic capacitance of the $i^{th}$ branch. A tuning ratio TR may be further defined as:

$$TR = \frac{C_{max}}{C_{min}}, \quad (2)$$

where $C_{max}$ is the maximum capacitance of the multi-branch tunable capacitance circuit according to equation (1) when all transistors of all branches are turned on, and $C_{min}$ is the minimum capacitance of the multi-branch tunable capacitance circuit according to equation (1) when all transistors of all branches are turned off. It can be seen from equations (1) and (2) that the tuning ratio may be limited by minimum capacitance $C_{min}$. Accordingly, adding more LSB branches in order to increase the precision of digitally tunable capacitor circuit 100 has diminishing returns due to the parasitic off capacitance of the additional branches.

Figure 2A:
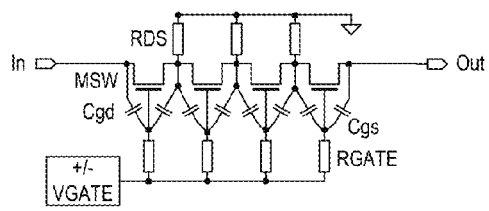

In embodiments of the present invention, additional LSBs of resolution may be added by using the off-capacitance of series stacked switching transistors. In an embodiment, a programmable capacitor branch may be implemented using the parasitic capacitances of an RF switch. FIG. 2a illustrates an RF switch that includes MOS transistors MSW having their load paths coupled in series and their gate connections coupled to the gate voltage generator VGATE via series gate resistors RGATE. In the embodiment of FIG. 2a, internal source/drain connections are coupled to ground via resistors RDS. In one example, embodiment resistors RDS may be about 400 kΩ, however, other values may be used. As shown, transistor MSW is implemented using an NMOS device, however, transistor MSW may be implemented using a PMOS device, or other transistor type in a CMOS-Bulk, CMOS-SOI using think or thick film silicon on insulator (SOI), GaAs-HEMTs, or other FET transistor type technology. In some cases, PIN Diodes may also be used.

Figure 2B:
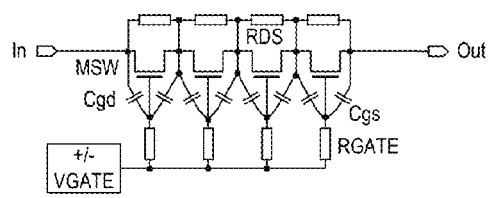

As shown, MOS transistors MSW have gate-drain capacitances Cgd and gate source capacitances Cgs. When resistances RGATE have an impedance that is sufficiently greater than the capacitive impedances of Cgd and Cgs, these parasitic overlap capacitances are symmetrically spread over all MOS transistors MSW when transistors MSW are shut off. Thus, the capacitance between input node In and output node Out is approximately the series combination of gate drain capacitances Cgd and gate source capacitances Cgs. FIG. 2b illustrates an alternative embodiment, RF switch, in which the source/drain connections of MOS transistors MSW are biased using series resistors RDS.

In an embodiment, the stacking of transistors in a common gate configuration is used to implement programmable capacitor. Assuming that RGATE has a high ohmic value, the overall parasitic off-capacitance of series stacked MOS transistors is:

$$C_{off} = \frac{WCgs}{2N}, \quad (3)$$

where W is the transistor width, Cgs the gate/source and gate/drain overlap capacitance, and N is the number of transistors coupled in series. As can be seen by the equation above, the overall parasitic OFF-capacitance $C_{off}$ increases as N is reduced and decreases as N is increased.

Figure 2C:
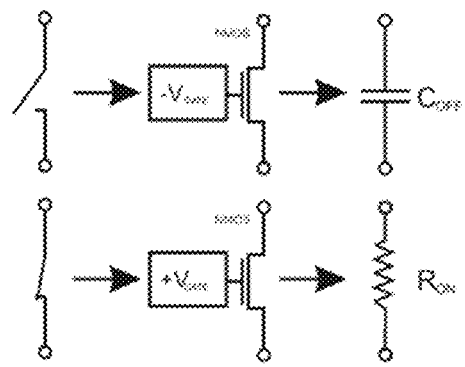

FIG. 2c illustrates a diagram how an NMOS switching transistor may be used to implement a resistance when the transistor is on and a capacitance when the transistor is off. In an embodiment, a positive voltage $V_{GATE}$ between the gate and source of an NMOS transistor is applied to turn on the NMOS transistor to achieve a drain-source resistance of $R_{ON}$. On the other hand, the NMOS transistor may be turned-off by applying voltage between the gate and source of the NMOS transistor that turns the NMOS transistor off. In some embodiments, a negative voltage $-V_{GATE}$ is applied between the gate and source of the NMOS transistor to ensure that that channel is fully off. When the transistor is off, parasitic capacitance $C_{OFF}$ is seen across the drain and source of the NMOS transistor. In some embodiments, a body floating technique is used in which the substrate of switching transistor is left floating and is not biased. In such embodiments, it is possible to bias the transistors with a positive voltage (e.g, 1.5 V) to turn the transistors on, and with a ground or zero voltage to turn the transistors off. Such embodiments may be implemented without using a charge pump to generate a negative voltage, thereby saving additional power and silicon area that would have been consumed by the charge pump. However, in some cases, using the floating body technique may trade-off some RF performance.

FIGS. 2d and 2e illustrate how a series of stacked NMOS transistors coupled in series with fixed capacitor $C_{FIXED}$ may be used to implement a programmable capacitance with low capacitive parasitics in some embodiments. As shown in FIG. 2d, series stacked NMOS transistors MSW are coupled in series with capacitor $C_{FIXED}$. Each transistor has a gate resistor RGATE coupled between its gate and its respective control voltage generator in order to decouple the gate-drain capacitance of transistor MSW from a possible low impedance of the control voltage generator. Resistor RDS coupled in parallel with the load path of transistor MSW, in conjunction with bias resistor RB coupled between an intermediate point in the load paths of the series coupled devices and ground, provides a bias voltage to all of the switching transistors. In an embodiment, RD is about 40 k$\Omega$ and resistor RB is about 1 M$\Omega$ to prevent RF signals from being coupled to ground. Alternatively other values may be used and/or other bias voltages may be used. In some embodiments, a positive voltage, such as 1.5 V may be applied between a gate and a source transistor in order to turn it on and a negative voltage, such as -1.5 V may be applied between a gate and a source of transistor in order to turn it off. In alternative embodiments, other voltages may be applied depending on the particular characteristics of the particular transistor being driven.

FIG. 2e is an equivalent circuit of the programmable capacitance of the circuit of FIG. 2d. Here, the off-capacitance of each NMOS transistor is modeled as a capacitor Cp that is selectively shorted by the on-channel resistance of each Rch of NMOS transistor via switch Sw. During operation, various switches are turned on and off in order to program the total capacitance of the chain of transistors coupled in series with capacitor $C_{FIXED}$. For example, when all of the switches Sw are closed, which corresponds with the case when all of the transistors MSW are turned on, the programmable capacitance has a maximum capacitance of about $C_{FIXED}$. On the other hand, when all of the switches are open, which corresponds to the case where all of the transistors MSW are turned off, the total capacitance of the programmable capacitance circuit is the series combination of fixed capacitor $C_{FIXED}$ and the parasitic off-capacitances Cp of each transistor MSW. Accordingly, by turning off all of the transistors MSW, a minimum capacitance is selected.

Figure 3A:
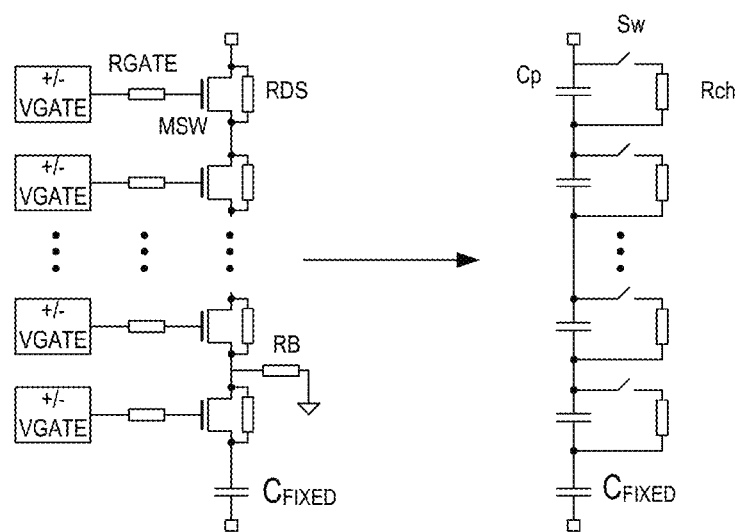
FIG. 3a-3b illustrate embodiment programmable capacitance circuits.

It should be appreciated that in various embodiments, any number of series stacked transistors may be used to implement embodiment programmable capacitors. In some cases, increasing the number of transistors has the added benefit reducing the voltage stress seen on each transistor device. In various embodiments, the number of series transistors is a function of the number of capacitance steps, as well as a function of the number of transistors needed to withstand voltage stress in cases where high amplitude signals are applied across the programmable capacitors. As such, transistors being used to implement selectable capacitances may be grouped together as shown in FIG. 3.

Figure 3A:
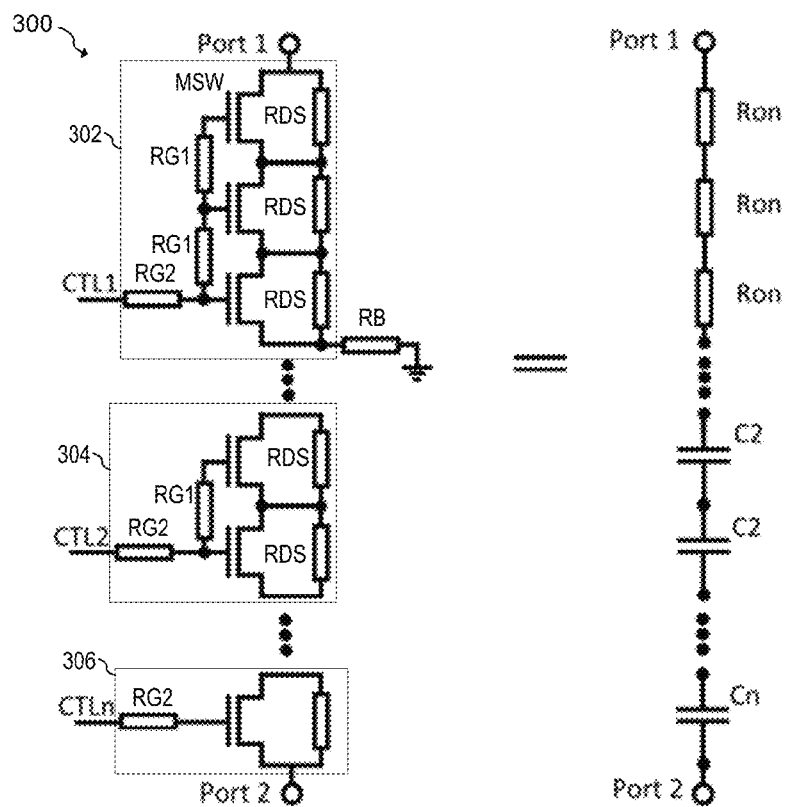

FIG. 3 illustrates programmable capacitor 300 that includes switch groups 302, 304 and 306 coupled between Port 1 and Port 2 that are used to implement embodiment series switched capacitance. As shown, group 302 has three NMOS switching transistors coupled in series that are controlled by control signal CTL1, group 304 has two NMOS switching transistors are controlled by control signal 304 and group 306 has a single NMOS switching transistor controlled by control signal CTLn. By using multiple transistors per group, the voltage handling of programmable capacitor 300 may be enhanced. In various embodiments, programmable capacitor 300 may have any number of switching groups. In some embodiments, groups 302, 304 and 306 are coupled in series with a fixed capacitor, such as a MIM capacitor. Alternatively, groups 302, 304 and 306 are coupled directly between ports 1 and 2 without an intervening fixed capacitor. In order maintain the capacitive characteristic of programmable capacitor 300, at least one transistor group is kept off.

As is further shown, groups 302 and 304 having more than one switching transistor includes resistors RG1 coupled between the respective gates of each of the group's switching transistors, and a gate resistor RG2 coupled between the gate of one the group's switching transistor and the groups respective control signal. By coupling resistors RG1 between respective gates of each groups transistors, the impedance seen by the gates of the top-most transistors of each group may be kept high to further reduce the effect of the gate-drain capacitance from being coupled to an AC ground due to a low impedance presented by the circuit that produces control signals CTL1, CTL2 and CTLn. In one embodiment, resistors RG1 and RG2 are about 150 k$\Omega$. Alternatively, other values may be used. In alternative embodiments of the present invention, the gates of each transistor in each group 302, 304 and 306 may be connected to its respective control signal in parallel with its own respective gate resistor.

In some embodiments, groups 302, 304 and 306 are turned-on successively starting with group 302 via control signal CTL1 and ending with last group 306 via control signal CTLn. The resulting programmed capacitance of programmable capacitor 300 depends on the capacitance of all the off-transistors together in series with the on-transistors. In some cases, the tunable capacitance may have a non-linear tuning characteristic due to the parasitic capacitance of one transistor being divided by the number of off-transistors. Assuming that each transistor MSW has the same size, the tunable capacitance of programmable capacitor 300 shown in FIG. 3a has a nonlinear behavior according to the following equation:

$$Cmsw_{off} = \frac{|C_{off(1xmsw)}|}{nb_{MSWoff}}, \quad (4)$$

where $C_{off(1\ xmsw)}$ represents the parasitic capacitance of one off-transistor stacked and $nb_{MSW\ off}$ represents the number of off-transistors within the same branch stacked transistors.

Figure 3B:
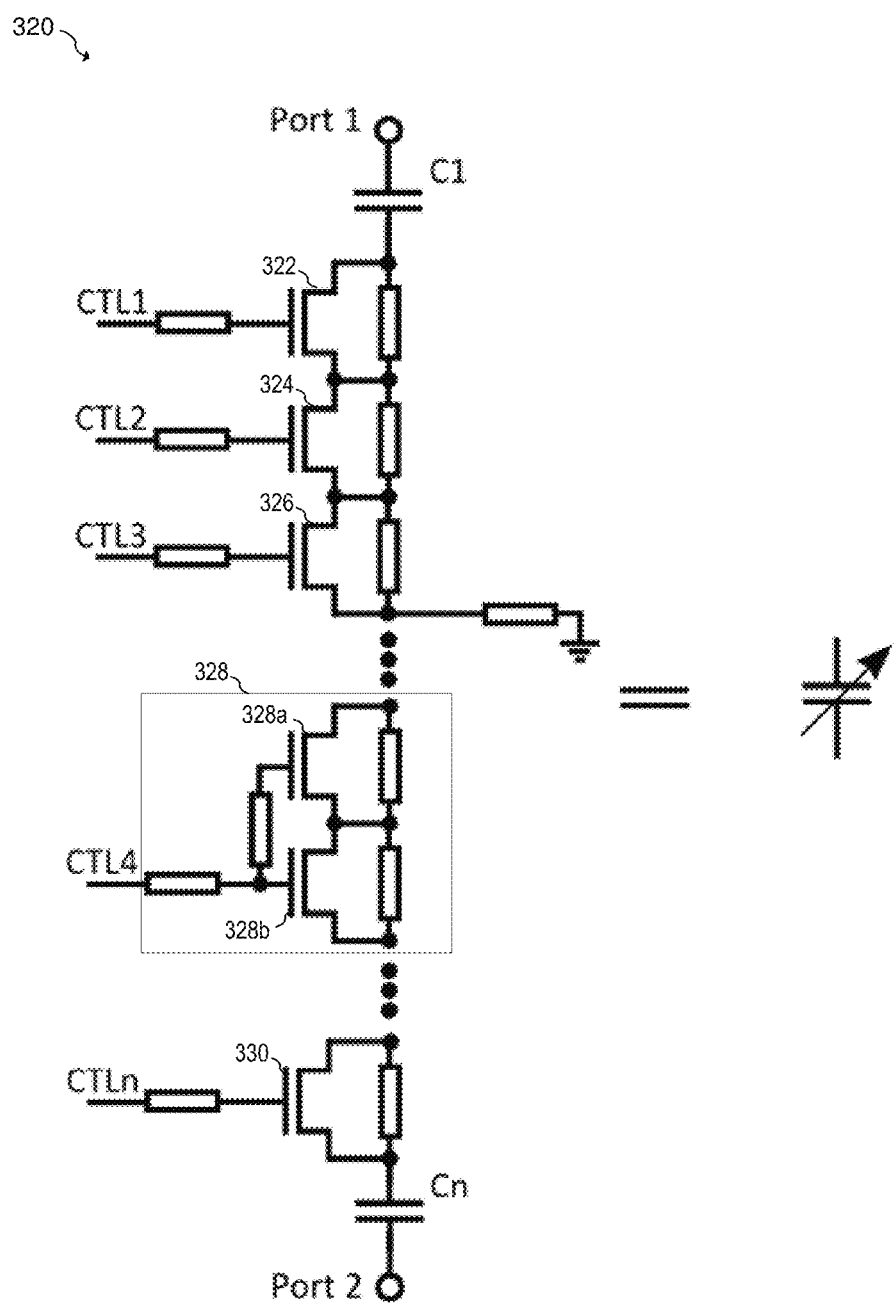

FIG. 3b illustrates another embodiment programmable capacitor 320 that includes fixed capacitors C1 and Cn, and series connected NMOS transistors 322, 324, 326, and 330 that are controlled by control signals CTL1, CTL2, CTL3, and CTLn, as well as NMOS transistors 328a and 328b that are grouped together in group 328 and controlled by control signal CTL4. In an embodiment, capacitors C1 and Cn are implemented using low-valued MIM capacitors. Since low-valued MIM capacitances provide a high impedance, the stress of the voltage applied between Port 1 and Port 2 may be concentrated over capacitors C1 and Cn instead of over series connected NMOS transistors 322, 324, 326, 328a, 328b and 330.

Figure 4:
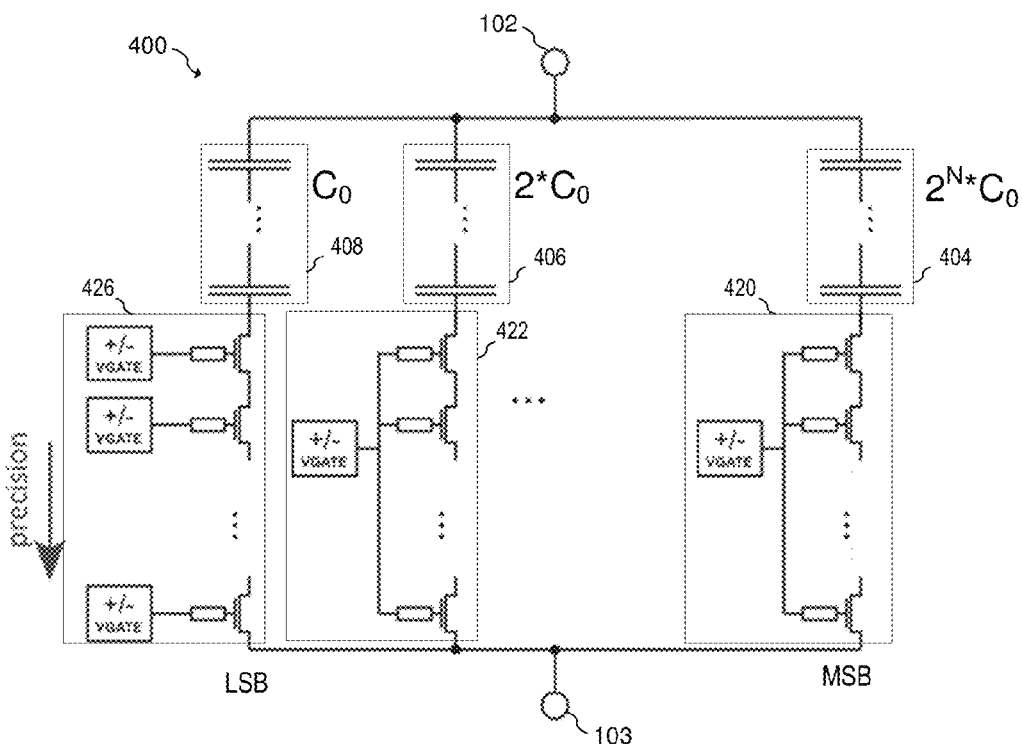
FIG. 4 illustrates an embodiment programmable capacitance circuits that utilizes binary weighted capacitors in parallel with series programmable capacitances.

FIG. 4 illustrates an embodiment multi-bit programmable capacitor 400 having a plurality of branches that include a multiple of capacitance $C_0$ in series with a switching transistor. These branches are represented by capacitor 404 coupled in series with switch 420 and capacitor 406 coupled in series with switch 422. As shown, capacitor 406 has a value of $2*C_0$ and capacitor 404 has a value of $2^{N}*C_0$. In various embodiments, further branches having other binary weighted multiples of $C_0$ of up a value of $2^{N-1}*C_0$ may also be coupled in parallel with the branches shown. A further branch including capacitor 408 coupled in series with series connected transistors 426 may be used to implement the LSBs of multi-bit programmable capacitor 400 according to embodiments described above. During operation, the LSBs of multi-bit programmable capacitor 400 may be selected by turning on an off various ones of series connected transistors 406. In some embodiments, the concept of series programmable branches described above and implemented with respect to series connected transistor 426 may also be applied to switching blocks 420 and 422 of the other branches. Also, in some embodiments, the capacitances of the various branches may incorporate a non-binary weighting.

In the embodiment 426, the global parasitic capacitance generated by a transistor stack is the parasitic of one off transistor divided by the number of transistors in off mode according to equation (4) described above. Accordingly, the global capacitance $C_{LSB}$ of the LSB branch 400 that includes capacitor 408 and series connected transistors 426 is:

$$C_{LSB} = \frac{C_0 \cdot Cmsw_{off}}{C_0 + Cmsw_{off}}, \quad (5)$$

where $C_0$ is the capacitance of capacitor 408, $Cmsw_{off}$ is the capacitance of series connected switches 426 when all transistors are off.

Figure 5:
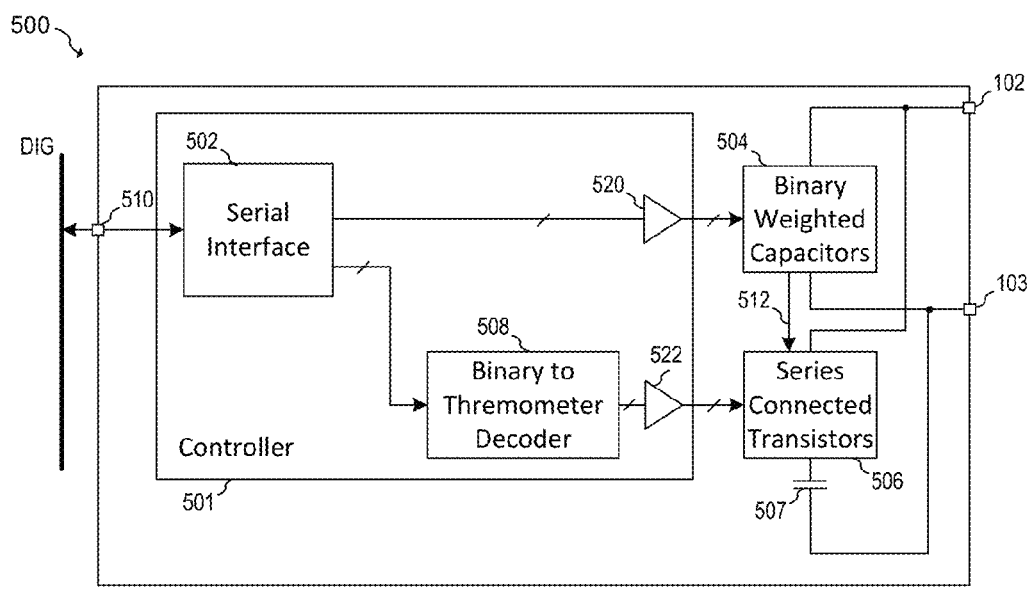
FIG. 5 illustrates a block diagram of an embodiment integrated circuit.

FIG. 5 illustrates a block diagram of an embodiment integrated circuit (IC) 500 that may be used to implement an embodiment programmable capacitance circuit. As shown, IC 500 includes controller 501 having an input coupled to digital interface bus DIG via interface pin 510 and coupled to an embodiment programmable capacitance circuit represented by binary weighted capacitor block 504, which implements the MSBs of the programmable capacitance and series connected transistor block 506 in series with capacitor 507 that implements the LSBs of the programmable capacitance as discussed with respect to embodiments herein. Each of binary weighted capacitor block 504 and programmable capacitance and series connected transistor block 506 is coupled in parallel with each other and to pins 102 and 103. In an embodiment, controller 501 includes a serial interface 502 coupled to digital bus DIG. Serial interface 502 may be implemented, for example, using an SPI interface, and I2C interface, MIPI/RFFE or other serial interface known in the art. In alternative embodiments of the present invention, serial interface 502 may also be implemented using a parallel interface.

In an embodiment, serial interface 502 reads a capacitance control word from bus DIG that includes MSBs and LSBs. The MSBs are sent directly to binary weighted capacitors 504, while the LSBs are processed by binary to thermometer decoder 508 coupled between serial interface 502 and series connected transistors 506. In some embodiments, the output of binary to thermometer decoder 508 are coupled to adjacent series connected transistors such that adjacent devices are activated and deactivated as the thermometer code increases and decreases. Controller 501 may be implemented using digital circuits known in the art. In some embodiments level shifting buffers 520 and 522 may be used to shift the logic levels used in controller 501 to voltage levels for the switches within binary weighted capacitor block 504 and series connected transistor block 506.

In some embodiments, the binary coding used to activate binary weighted capacitors 504 is also routed to series connected transistors 506, for example, via link 512. Also, in some embodiments, the binary coding may also be used to activate the bits utilizing the thermometer coding. For example, one register (not shown) generates the full number of binary coded bits (e.g, 7 bits), while a second register generates a thermometer code based on the last few least significant bits (e.g, 2 bits). In such embodiments, the last few bits could be made to incorporate a hybrid binary/thermometer coding scheme for more flexibility.

It should be understood that IC 500 is just one of many examples of embodiment implementations for embodiment programmable capacitor systems. In alternative embodiments, other circuits could be used. For example, in one alternative embodiment, a lookup table may be used to map an input code used to select a capacitance value to switch signals used to program binary weighted capacitor block 504 and series connected transistor block 506. Such an implementation may be used, for example, to calibrate and/or linearize the capacitance vs input code response. For example, in some embodiments, series connected transistor block 506 may have extra programming levels that may be used as calibration bits. In some embodiments, the global tolerance of the particular process being used can be calibrated by applying a code offset to compensate for the offset capacitance. For example, if the tolerance for MIM capacitors is about +/−7%, an offset capacitance of +/−7% could be applied. This offset capacitance may be applied to one or more of the total bits such that the remaining bits remain unchanged. Calibration bits may be allocated from existing LSB bits, in which some range is sacrificed, or may be implemented using additional branches. In some embodiments, calibration may be programmed by a board or systems manufacturer during production of the RF system. In some embodiments, a lookup table may also be used to produce a non-linear mapping from input code to output capacitance.

Figure 6:
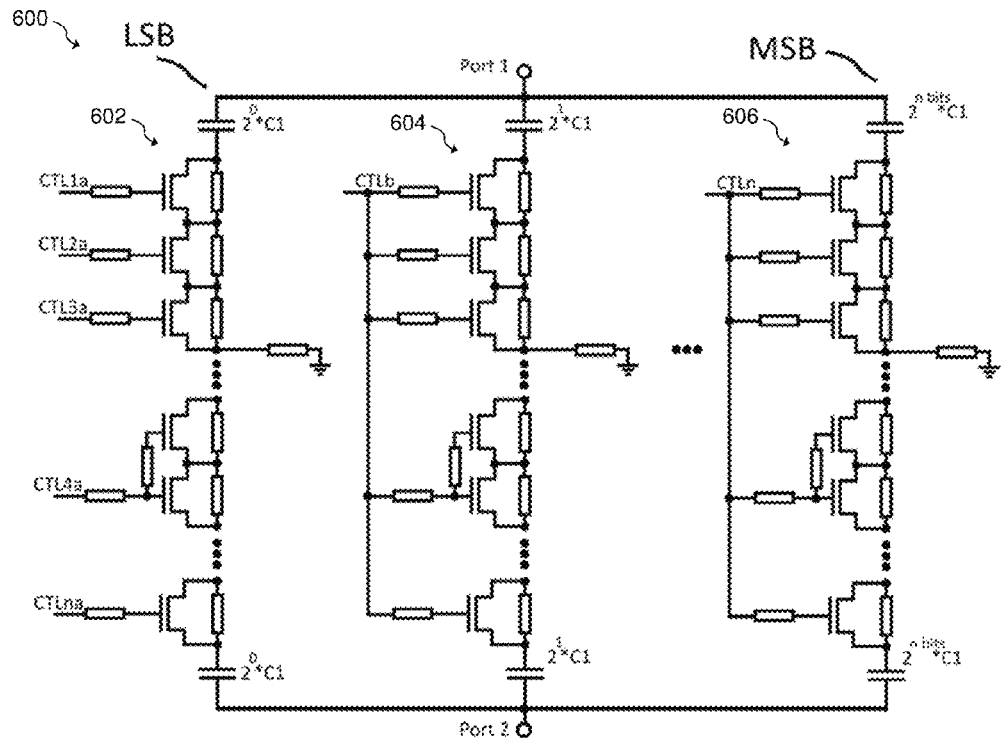
FIG. 6 illustrates further embodiment programmable capacitance circuit.

FIG. 6 illustrates a specific example embodiment of programmable capacitance 600 that includes n-branches that each includes two capacitors that each have a value of $2^{n-1}*C1$. However, only the first LSB branch 602, second branch 604 and MSB branch 606 is shown for simplicity of illustration. Also, for simplicity of illustration, each branch is shown with six transistors. In alternative embodiments greater or fewer transistors may be used. As shown, control signals CTLb and CTLn associated with second branch 604 and MSB branch 606 are connected to the gates of all switching transistors, while control signals CTL1a, CTL2a, CTL3a, CTL4a and CTLna are connected to different transistors and/or groups of transistors within LSB branch 602. As is further shown, there is a group of two transistors coupled to control signal CTL4a, while the remaining transistors are shown coupled to their own individual transistors. It should be understood that in alternative embodiments, various transistors within LSB branch 602 may be grouped or ungrouped. In some embodiments, separate control of individual transistors in a branch, as implemented by branch 602, may also be applied to one or more of the other branches 604 and 606 in order to provide finer resolution and more programming flexibility.

Figure 7A:
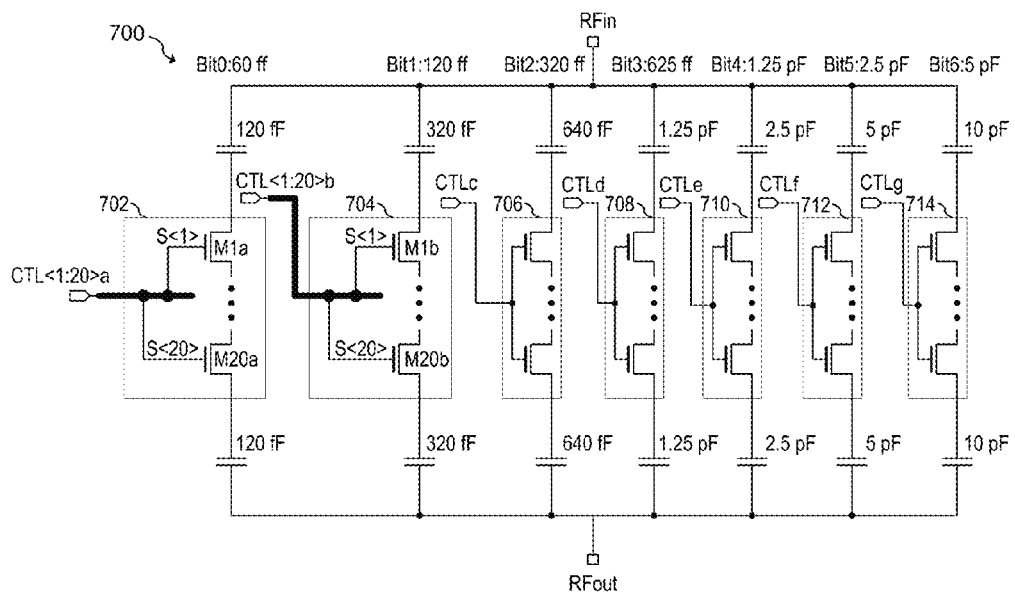
FIGS. 7a-7b illustrate a schematic and a corresponding layout diagram of a programmable capacitance circuit IC.

FIG. 7a illustrates a schematic of an embodiment integrated circuit (IC) 700 that implements a programmable capacitance of having 7 bits of course resolution, plus additional fine resolution provided by two branches of individually selectable series connected transistors according to embodiments described above. As shown, IC 700 includes seven branches. The first branch includes individually addressable series connected transistors 702 coupled in series with two 120 fF capacitors, and the second branch includes individually addressable series connected transistors 704 coupled in series with two 320 fF capacitors. The transistors of the first branch are addressable using 20 bit control signals CTL<1:20>a to select a capacitance that ranges from a very low capacitance to capacitance of about 60 fF, and the transistors of the second branch are addressable using 20 bit control signals CTL<1:20>b to select a capacitance that ranges from a very low capacitance to a capacitance of about 160 fF. In various embodiments, the second branch is programmed to have a nominal capacitance about 120 fF via control signals CTL<1:20>b, however, any selectable value may be used during operation. IN some embodiments series connected transistors 702 and 704 have 20 series connected transitors M1a to M20a and M1b to M20b, respectively. Alternatively, series connected transistors 702 and 704 may contain more than 20 transistors by grouping multiple transistors together to receive the same control signal.

The third branch includes transistors 706 coupled in series with two 640 fF capacitors, the fourth branch includes transistors 708 coupled in series with two 1.25 pF capacitors, the fifth branch includes transistors 710 coupled in series with two 2.5 pF capacitors, the sixth branch includes transistors 712 coupled in series with two 5 pF capacitors, and the seventh branch transistors 714 coupled in series with two 10 pF capacitors. All of the transistors in each transistor set 706, 708, 710, 712 and 714 are connected to their respective control signal CTLc, CTLd, CTLe, CTLf and CTLg, thus each transistor set 706, 708, 710, 712 and 714 functions as a switch that selects the respective branch capacitors. Accordingly, the third branch has a selectable capacitance of 320 fF, the fourth branch has a selectable capacitance of 625 fF, the fifth branch has a selectable capacitance of 1.25 pF, the sixth branch has a selectable capacitance of 2.5 pF and the sixth branch has a selectable capacitance of 5 pF. It should be understood that in alternative embodiments of the present invention, additional branches of individually selectable series connected transistors may be used, the values of the capacitors of the individual branches may be different, greater or fewer than seven branches may be used, and greater or fewer than 20 transistors may be stacked in series. While all of the branches are not exactly binary weighted in IC 700, binary weighting may be applied to other embodiments.

Figure 7B:
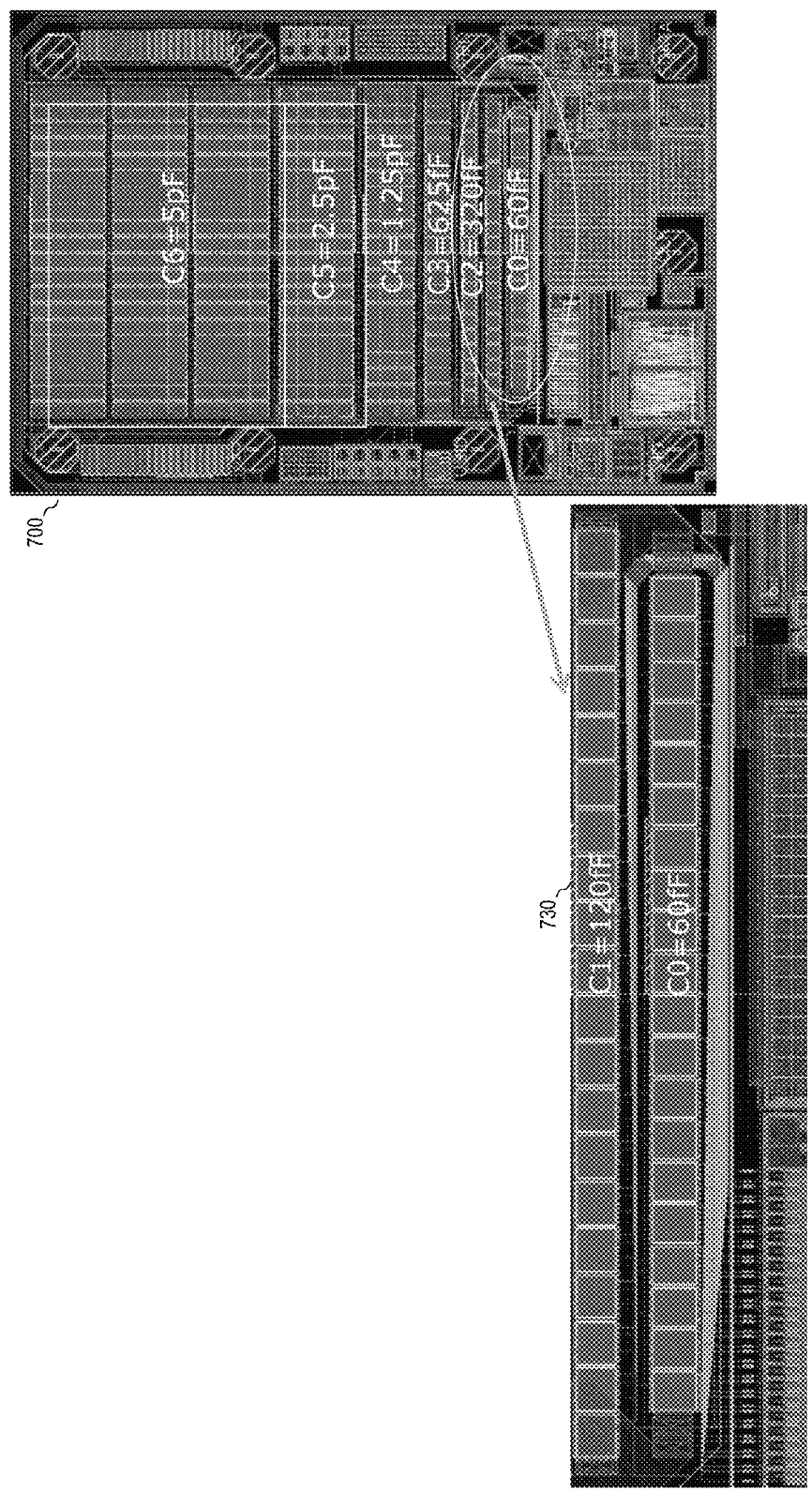

FIG. 7b illustrates a layout diagram of an embodiment integrated circuit (IC) 700 that corresponds with the schematic of FIG. 7a, as well as a detailed view 730 of capacitors of the first and second branches. In an embodiment, IC 700 is implemented using a 130 nm bulk CMOS process in which switching transistors are driven with at least 1.5 V to turn the transistors on and not greater than −1.5 V to turn the transistors off. However, in alternative embodiments, other processes may be used.

Figure 8A:
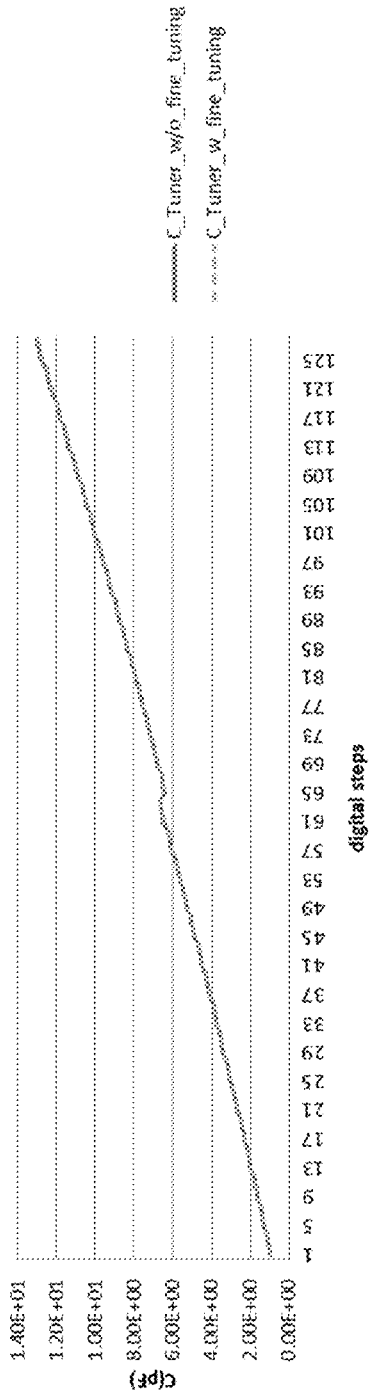
FIGS. 8a-8c illustrate graphs of performance measurements of an embodiment programmable capacitance IC.
Figure 8B:
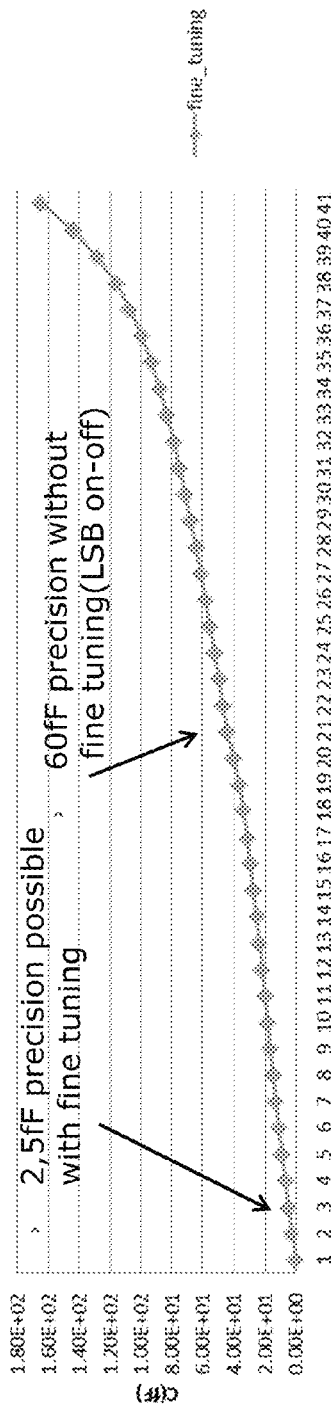
Figure 8C:
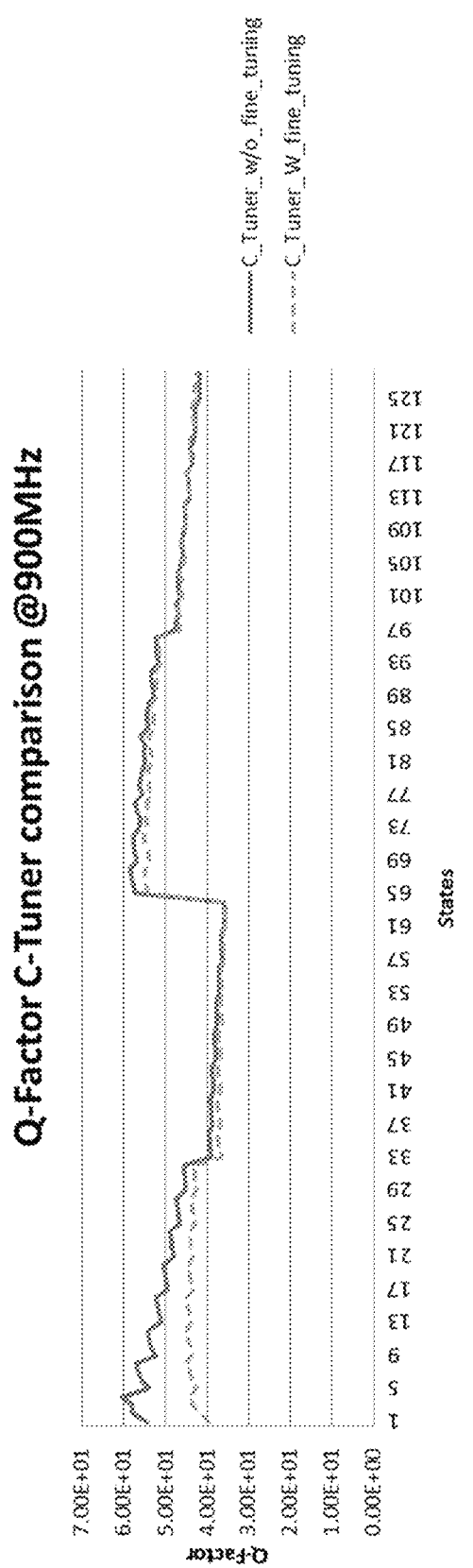

FIGS. 8a-8c illustrate graphs of measurement results of an embodiment programmable capacitance circuit corresponding to the layout of FIG. 7. FIG. 8a illustrates a graph of measured capacitance vs. input code taken at 900 MHz for the first seven bits of resolution that do not utilize the fine tuning capability of the embodiment LSB capacitance elements constructed from series connected transistors. As shown, the programmable capacitance values range from about 1 pF to about 13 pF. FIG. 8b illustrates a graph of measured capacitance vs. input code in which the fine tuning capability of the embodiment LSB capacitance elements constructed from series connected transistors are utilized. In this measurement, the first two 60 fF and 120 fF LSB capacitors are used in conjunction with embodiment fine tuning techniques. As shown, 2.5 fF precision is possible using embodiment programmable capacitance systems and methods.

FIG. 8c illustrates a graph of Q-factor vs. input code for both cases of a programmable capacitor with embodiment fine tuning and without embodiment fine tuning. As shown, at the first 32 input codes, the Q-factor of a programmable capacitance using embodiment fine tuning systems and method are lower than a programmable capacitance without an embodiment fine tuning system. The Q-factor for a capacitor may be defined as:

$$Q = \frac{1}{R \cdot C \cdot 2 \cdot \pi \cdot f}, \qquad (6)$$

where R is the series resistance, C is the capacitance of the capacitor, and f is the frequency at which the Q factor measurement is taken. The reduction of Q factor in for the lower input codes may be due to the series resistance of the series connected switching transistors in the LSB branch. It should be understood that the measurement results shown in FIGS. 8a-8c are just a specific example of embodiment system performance. In alternative embodiments of the present invention, measured performance may vary.

Figure 9A:
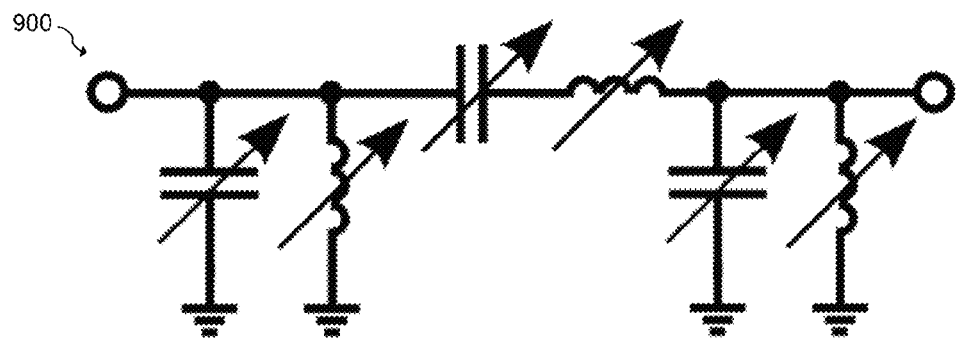
FIGS. 9a-9e illustrate embodiment RF circuits that utilize embodiment programmable capacitance circuits.

FIGS. 9a-9e illustrate various circuits in which embodiment programmable capacitors may be incorporated. Such circuits may be incorporated, for example, within cellular handheld devices and other RF systems. FIG. 9a illustrates a tunable impedance matching circuit 900 that may be used in an RF circuit, for example, to match an impedance at an output of an RF circuit and/or an antenna or other circuit to a characteristic impedance, such as 50Ω or to another impedance. As shown, tunable impedance matching circuit 900 is a PI network that includes a programmable parallel resonant circuit in the shunt branches and a programmable series resonant circuit in the series branch. Each resonant circuit includes a variable capacitor and a variable inductor. Each variable capacitor may be implemented, for example, using embodiment programmable capacitor circuits disclosed herein. It should be understood that the matching circuit 900 is just one example of many matching network topologies that may be used using embodiment programmable capacitors.

Figure 9B:
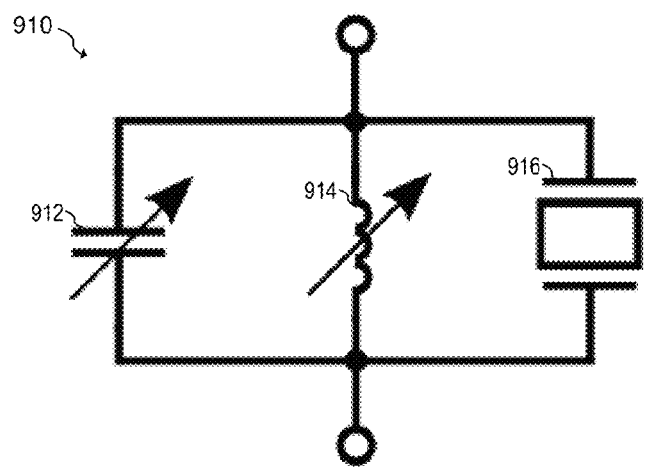
Figure 9C:
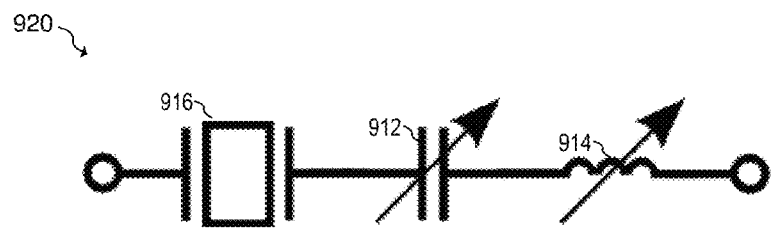

FIG. 9b illustrates an embodiment parallel surface acoustic wave (SAW) circuit 910, and FIG. 9c illustrates an embodiment series surface acoustic wave (SAW) circuit 920 that each includes a variable capacitor 912, a variable inductor 914, and a SAW filter 916. During operation, the center frequency of each circuit is fine tunable using variable capacitor 912 and variable inductor 914. In various embodiments, each variable capacitor may be implemented, for example, using embodiment programmable capacitor circuits disclosed herein. SAW circuits 910 and 920 may be used, for example, as filters RF systems to provide tuning accuracy and a wide tuning range. In alternative embodiments, circuits 910 and 920 may be implemented using BAW filter, FBAR resonator, or other resonator circuit.

Figure 9D:
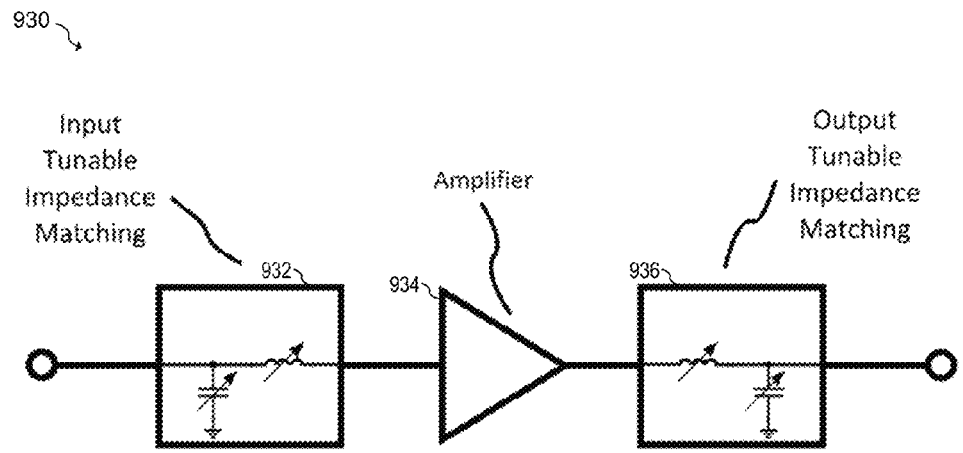

FIG. 9d illustrates an RF system 930 that includes an amplifier 934 having a tunable input matching network 932 coupled to its input and a tunable matching network 936 coupled to its output. Amplifier 934 may represent, for example an LNA, RF driver amplifier, or an RF power amplifier (PA). In various embodiments, variable capacitors within tunable input matching network 932 and/or tunable matching network 936 may be implemented using embodiment programmable capacitors. For example, in the case where amplifier 934 is an LNA, tunable input matching network 932 may be tuned improve the noise figure of the system with the aid of an embodiment programmable capacitor. In case wherein amplifier 934 is a PA, a tunable output matching network 936 may be used to improve the power efficiency of amplifier 934 with the aid of an embodiment capacitor.

Figure 9E:
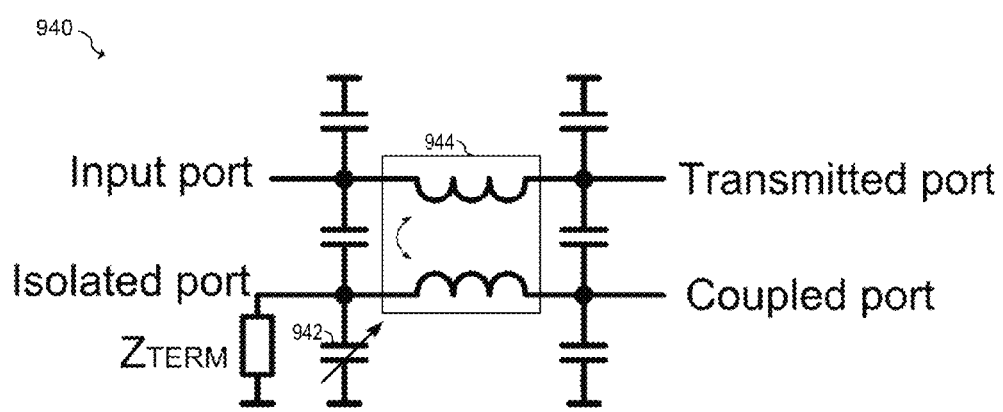

FIG. 9e illustrates an embodiment directional coupler 940 that includes an input port, a transmitted port, a coupled port and an isolated port. The directional coupler 940 includes a magnetic transformer 944 and various capacitances coupled among the ports of the magnetic transformer. The isolated port of the coupler is terminated with a resistor $Z_{TERM}$. By tuning the termination resistor with a variable capacitor 942 that is implemented according to embodiments disclosed herein, the directivity of the coupler may be optimized by varying the capacitance of variable capacitor 942. In various embodiments, the value of termination resistance $Z_{TERM}$ is between about 20Ω and 100Ω, although resistances outside of this range may also be implemented depending on the application and its particular specifications.

Figure 10:
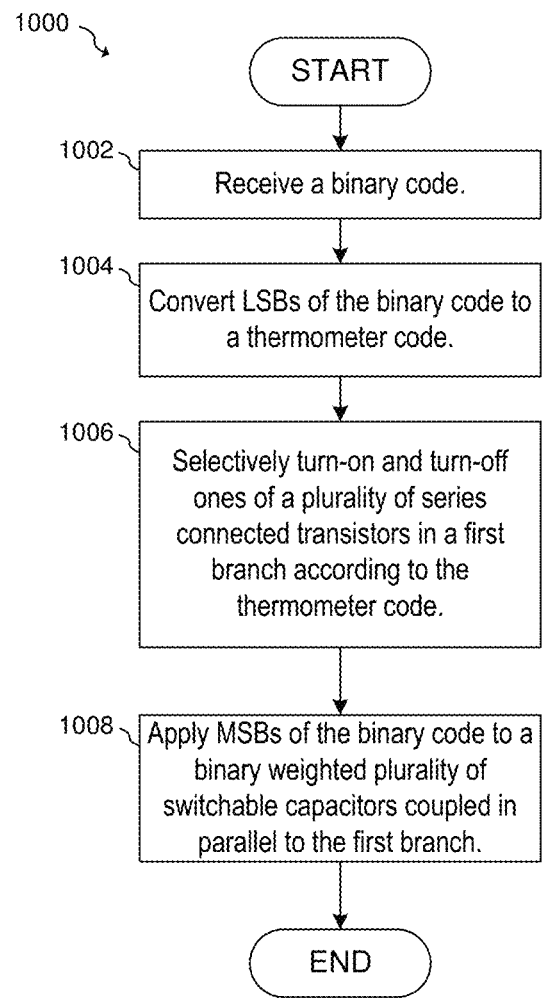
FIG. 10 illustrates a flowchart of an embodiment method.

FIG. 10 illustrates an embodiment method 1000 of operating an adjustable capacitance circuit comprising a first branch comprising plurality of transistors having load paths coupled in series with a first capacitor. In step 1002, a binary code is received. As described above with respect to FIG. 5, this binary code may be received via a serial digital interface, or other type of digital interface (step 1002). In step 1004, the LSBs of the received binary code are converted to a thermometer code. Next, ones of the plurality of the series connected transistors of the first branch are turned-on and turned-off according to the thermometer code in step 1006. In step 1008 the MSBs of the received binary code are applied to a binary weighted plurality of switchable capacitors coupled in parallel to the first branch.

Embodiments of the present invention are summarized here. Other embodiments can also be understood from the entirety of the specification and the claims filed herein. One general aspect includes a method of operating an adjustable capacitance circuit including a first branch including plurality of transistors having load paths coupled in series with a first capacitor. The method includes programming a capacitance by selectively turning-on and turning-off ones of the plurality of transistors, where the load path of each transistor of the plurality of transistors is resistive when the transistor is on and is capacitive when the transistor is off.

Implementations may include one or more of the following features. The method where programming the capacitance further includes selectively activating a switchable capacitors coupled in parallel with the first branch. In some embodiments, the adjustable capacitance circuit includes at least one further branch including a further plurality of transistors having load paths coupled in series with a further capacitor, and programming the capacitance further includes selectively turning-on and turning-off ones of the further plurality of transistors. Programming the capacitance may further include selectively activating a plurality of switchable capacitors coupled in parallel with the first branch.

In some embodiments, the plurality of switchable capacitors are binary weighted, and programming the capacitance further includes receiving a binary code, applying most significant bits of the binary code to the binary weighted plurality of switchable capacitors, converting least significant bits of the binary code to a thermometer code, and applying the thermometer code to control terminals of the plurality of transistors of the first branch. In an embodiment, selectively turning-on and turning-off ones to the plurality of transistors includes applying voltages to control terminals of the plurality of transistors.

Another general aspect includes an adjustable capacitance circuit including an adjustable capacitance cell coupled between a first terminal and a second terminal. The adjustable capacitance cell includes a first capacitor having a first end coupled to the first terminal and a second end coupled to a first node, a plurality of switchable transistor cells having load paths coupled in series between the first node and the second terminal, where each switchable transistor cell includes a control terminal and a transistor, the load path of each switchable transistor cell is capacitive when a first signal level is applied to its control terminal, and the load path of each switchable transistor cell is resistive when a second signal level is applied to its control terminal. The adjustable capacitance circuit also includes a control circuit having outputs coupled to the control terminals of the plurality of switchable transistor cells. The control circuit is configured to adjust a capacitance of the adjustable capacitance cell by selectively applying the first signal level and the second signal level to the control terminals of the plurality of switchable transistor cells.

Implementations may include one or more of the following features. The adjustable capacitance circuit where the control circuit is configured to apply the first signal level to control terminals of a first group of the plurality of switchable transistor cells, and apply the second signal level to control terminals of a second group of the plurality of switchable transistor cells. The first capacitor may include a plurality of series connected capacitors. In some embodiments, the adjustable capacitance circuit further includes a second capacitor coupled between the load paths of the plurality of switchable transistor cells and the second terminal. The control circuit may be configured to successively increase the capacitance of the adjustable capacitance cell by successively transitioning respective control terminals of adjacent switchable transistor cells from the first signal level to the second signal level; and successively decrease the capacitance of the adjustable capacitance cell by successively transitioning the respective control terminals of adjacent switchable transistor cells from the second signal level to the first signal level.

In some embodiments, the control circuit includes a binary to thermometer decoder that includes output terminals coupled to the respective control terminals of adjacent switchable transistor cells. Each each of the plurality of switchable transistor cells may include an RF MOS transistor having a gate coupled to the control terminal, where the RF MOS transistor is off when the first signal level is applied to the gate and the RF MOS transistor is on when the second signal level is applied to the gate. In some embodiments, each of the plurality of switchable transistor cells further includes a gate resistor coupled between the gate of the RF MOS transistor and the control terminal, and a bias resistor coupled between a drain and a source of the RF MOS transistor. At least one of the plurality of switchable transistor cells may include a plurality of RF MOS transistors coupled in series, where gates of the plurality of RF MOS transistors are coupled to the control terminal of the at least one of the plurality of switchable transistor cells. In an embodiment, at least one of the plurality of switchable transistor cells further includes first series resistors coupled between gates of adjacent ones of the plurality of RF MOS transistors and a second resistor coupled between a first one of the plurality of RF MOS transistors and the control terminal of the at least one of the plurality of switchable transistor cells.

In an embodiment, a maximum voltage stress is proportional to a number of switchable transistor cells of the plurality of switchable transistor cells. In some embodiments, a minimum capacitance step size is inversely proportional to a number of the plurality of switchable transistor cells of the plurality of switchable transistor cells. The adjustable capacitance circuit may further include a switchable capacitance cell coupled in parallel with the adjustable capacitance cell, where the switchable capacitance cell includes a switching transistor coupled in series with a second capacitor.

A further general aspect includes a circuit having a first branch coupled between a first terminal and a second terminal, where the first branch includes first transistors having load paths coupled in series with a first capacitor, and the load path of each of the first transistors is resistive when the first transistor is on and is capacitive when the first transistor is off. The circuit also includes a switchable capacitance circuit coupled in parallel with the first branch and a controller having output terminals coupled to control terminals of the first transistors of the first branch and to a control terminal of the switchable capacitance circuit. The controller is configured to program a capacitance of the circuit by selectively turning-on and turning-off ones of the first transistors of the first branch.

Implementations may include one or more of the following features. The circuit further including: a second branch coupled between the first terminal and a second terminal, the second branch including second transistors having load paths coupled in series with a second capacitor, where the load path of each second transistor of the second transistors is resistive when the second transistor is on and is capacitive when the second transistor is off, and the controller is further configured to program the capacitance of the circuit by selectively turning-on and turning-off ones of the second transistors of the second branch. In some embodiments, the switchable capacitance circuit includes a binary weighted capacitor array coupled to a plurality of corresponding switches; and the controller is configured to program the switchable capacitance circuit includes turning on and off ones of the plurality of corresponding switches. In some embodiments, a capacitance of the first capacitance is one-half of a capacitance of a smallest capacitor of binary weighted capacitor array.

In an embodiment, the controller includes a binary to thermometer decoder having outputs coupled to the control terminals of the first transistors of the first branch. The circuit may further include a digital input interface having most significant bits coupled to the plurality of corresponding switches of the switchable capacitance circuits and least significant bits coupled to input terminals of the binary to thermometer decoder.

Advantages of embodiments of the present invention include the ability to implement small programmable capacitor values and fine tuning in the context of a programmable capacitor. Such embodiments may be used to implement finely tunable matching networks, tunable filters, directional couplers and other circuits.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A method of operating an adjustable capacitance circuit comprising a first branch comprising plurality of transistors, each having a load path coupled in series with a first capacitor along a single current path, the method comprising:
    programming a capacitance by selectively turning-on and turning-off ones of the plurality of transistors via control terminals of the plurality of transistors, wherein the load path of each transistor of the plurality of transistors is resistive when the transistor is on and is capacitive when the transistor is off, wherein a programmed capacitance of the first branch is substantially based on a series combination of capacitances of the transistors that are turned off along the single current path, and wherein programming comprises:
        setting the programmed capacitance of the first branch to a first value by turning on a first transistor of the plurality of transistors and turning off a second transistor of the plurality of transistors, and
        setting the programmed capacitance of the first branch to a second value by turning off the first transistor of the plurality of transistors and turning off the second transistor of the plurality of transistors, wherein the second value is less than the first value.

2. The method of claim 1, wherein programming the capacitance further comprises selectively coupling switchable capacitors in parallel with the first branch.

3. The method of claim 1, wherein:
    the adjustable capacitance circuit comprises at least one further branch comprising a further plurality of transistors having load paths coupled in series with a further capacitor; and
    programming the capacitance further comprises selectively turning-on and turning-off ones of the further plurality of transistors via control terminals of the further plurality of transistors.

4. The method of claim 2, wherein switchable capacitors are binary weighted.

5. The method of claim 4, wherein programming the capacitance further comprises:
    receiving a binary code;
    applying most significant bits of the binary code to the switchable capacitors;
    converting least significant bits of the binary code to a thermometer code; and
    applying the thermometer code to the control terminals of the plurality of transistors of the first branch.

6. The method of claim 1, wherein selectively turning-on and turning-off ones to the plurality of transistors comprises applying voltages to the control terminals of the plurality of transistors.

7. An adjustable capacitance circuit comprising:
    an adjustable capacitance cell coupled between a first terminal and a second terminal, the adjustable capacitance cell comprising
        a first capacitor having a first end coupled to the first terminal and a second end coupled to a first node,
        a plurality of switchable transistors having respective control terminals and having respective load paths coupled in series between the first node and the second terminal, wherein
            the first capacitor coupled in series with the load paths of the plurality of switchable transistors form a single current path, the load path of each switchable transistor is capacitive when a first signal level is applied to its control terminal to turn the switchable transistor off, the load path of each switchable transistor is resistive when a second signal level is applied to its control terminal to turn the switchable transistor on, and a programmed capacitance of the adjustable capacitance cell is substantially based on a series combination of capacitances of the switchable transistors that are turned off along the single current path; and a control circuit having outputs coupled to the control terminals of the plurality of switchable transistors, the control circuit configured to adjust a capacitance of the adjustable capacitance cell by selectively applying the first signal level and the second signal level to the control terminals of the plurality of switchable transistors, wherein the control circuit is further configured is configured to apply the first signal level to control terminals of a first group of the plurality of switchable transistors and apply the second signal level to control terminals of a second group of the plurality of switchable transistors different from the first group.

8. The adjustable capacitance circuit of claim 7, wherein the switchable transistors of the first group of the plurality of switchable transistors are adjacent to each other and to the first node, and the switchable transistors of the second group of the plurality of switchable transistors are adjacent to each other and to the second terminal.

9. The adjustable capacitance circuit of claim 7, wherein the first capacitor comprises a plurality of series connected capacitors.

10. The adjustable capacitance circuit of claim 7, further comprising a second capacitor coupled between the load paths of the plurality of switchable transistors and the second terminal.

11. The adjustable capacitance circuit of claim 7, wherein the control circuit is configured to:

successively increase the capacitance of the adjustable capacitance cell by successively transitioning respective control terminals of adjacent switchable transistor cells from the first signal level to the second signal level; and successively decrease the capacitance of the adjustable capacitance cell by successively transitioning the respective control terminals of adjacent switchable transistors from the second signal level to the first signal level.

12. The adjustable capacitance circuit of claim 11, wherein the control circuit comprises a binary to thermometer decoder, the binary to thermometer decoder comprising output terminals coupled to the respective control terminals of adjacent switchable transistors.

13. The adjustable capacitance circuit of claim 7, wherein each of the plurality of switchable transistors is an RF MOS transistor, wherein the control terminal of each switchable transistor of the plurality of switchable transistors is a gate terminal its corresponding RF MOS transistor, wherein the RF MOS transistor is off when the first signal level is applied to the gate terminal and the RF MOS transistor is on when the second signal level is applied to the gate terminal.

14. The adjustable capacitance circuit of claim 13, further comprising:

a plurality of gate resistors, each gate resistor coupled between a gate of each RF MOS transistor and its gate terminal; and a plurality of bias resistors, each bias resistor coupled between a drain and a source of the RF MOS transistor.

15. The adjustable capacitance circuit of claim 13, wherein gates terminals of a first group of RF MOS transistors coupled in series are coupled together.

16. The adjustable capacitance circuit of claim 15, further comprising a first series resistor coupled between gates of adjacent RF MOS transistors, and a second resistor coupled between the gate of a first of the adjacent RF MOS transistors and an output of the control circuit.

17. The adjustable capacitance circuit of claim 7, wherein a maximum voltage stress that the switchable transistors can withstand is proportional to a number of switchable transistors of the plurality of switchable transistors.

18. The adjustable capacitance circuit of claim 7, wherein a minimum capacitance step size is inversely proportional to a number of the plurality of switchable transistors.

19. The adjustable capacitance circuit of claim 7, further comprising a switchable capacitance cell coupled in parallel with the adjustable capacitance cell.

20. The adjustable capacitance circuit of claim 19, wherein the switchable capacitance cell comprises a switching transistor coupled in series with a second capacitor.

21. A circuit comprising:

a first branch coupled between a first terminal and a second terminal, the first branch comprising first transistors having load paths coupled in series with a first capacitor along a single current path, wherein the load path of each of the first transistors is resistive when the first transistor is on and is capacitive when the first transistor is off; and a switchable capacitance circuit coupled in parallel with the first branch; and a controller having output terminals coupled to control terminals of the first transistors of the first branch and to a control terminal of the switchable capacitance circuit, the controller configured to program a capacitance of the circuit by selectively turning-on and turning-off ones of the first transistors of the first branch via the control terminals of the first transistors of the first branch, wherein a programmed capacitance of the first branch is substantially based on a series combination of capacitances of the first transistors that are turned-off along the single current path, and the controller is further configured is configured to selectively turn-on a first group of the first transistors and selectively turn-off a second group of the first transistors different from the first group.

22. The circuit of claim 21, further comprising:

a second branch coupled between the first terminal and a second terminal, the second branch comprising a second capacitor and second transistors, each second transistor having a load path coupled in series with the second capacitor, wherein the load path of each second transistor of the second transistors is resistive when the second transistor is on and is capacitive when the second transistor is off, and the controller is further configured to program the capacitance of the circuit by selectively turning-on and turning-off ones of the second transistors of the second branch via control terminals of the second transistors.

23. The circuit of claim 21, wherein:

the switchable capacitance circuit comprises a binary weighted capacitor array coupled to a plurality of corresponding switches; and the controller is configured to program the switchable capacitance circuit comprises turning on and off ones of the plurality of corresponding switches.

24. The circuit of claim 23, wherein a capacitance of the first capacitor is one-half of a capacitance of a smallest capacitor of binary weighted capacitor array.

25. The circuit of claim 23, wherein the controller comprises a binary to thermometer decoder having outputs coupled to the control terminals of the first transistors of the first branch.

26. The circuit of claim 25, further comprising a digital input interface having most significant bits coupled to the plurality of corresponding switches of the switchable capacitance circuit and least significant bits coupled to input terminals of the binary to thermometer decoder.

* * * * *